United States Patent
Jain et al.

(10) Patent No.: US 10,797,683 B1
(45) Date of Patent: Oct. 6, 2020

(54) CALIBRATION CIRCUIT AND ASSOCIATED CALIBRATING METHOD CAPABLE OF PRECISELY ADJUSTING CLOCKS WITH DISTORTED DUTY CYCLES AND PHASES

(71) Applicant: FARADAY TECHNOLOGY CORPORATION, Hsinchu (TW)

(72) Inventors: Vinod Kumar Jain, Hsinchu (TW); Chi-Yeu Chao, Hsinchu (TW); Prateek Kumar Goyal, Hsinchu (TW); Han-Kyul Lim, Hsinchu (TW)

(73) Assignee: Faraday Technology Corp., Hsin-Chu (TW)

( * ) Notice: Subject to any disclaimer, the term of this patent is extended or adjusted under 35 U.S.C. 154(b) by 0 days.

(21) Appl. No.: 16/811,371

(22) Filed: Mar. 6, 2020

(51) Int. Cl.
*H03K 3/017* (2006.01)
*H03K 5/156* (2006.01)
*G06F 1/04* (2006.01)

(52) U.S. Cl.
CPC .............. *H03K 3/017* (2013.01); *G06F 1/04* (2013.01); *H03K 5/1565* (2013.01)

(58) Field of Classification Search
CPC .... H03K 5/1565; H03K 5/133; H03K 5/1508; H03K 7/08
See application file for complete search history.

(56) References Cited

U.S. PATENT DOCUMENTS

| | | | | |
|---|---|---|---|---|
| 7,612,620 B2* | 11/2009 | Rausch | ........... | G11C 29/02 327/144 |
| 7,839,194 B2* | 11/2010 | Chang | ........... | G06F 1/06 327/172 |
| 7,999,589 B2* | 8/2011 | Lin | ........... | H03K 5/1565 327/172 |
| 8,228,105 B2* | 7/2012 | McLeod | ........... | H03K 5/1565 327/172 |
| 8,487,680 B1* | 7/2013 | Chung | ........... | H03K 5/1565 327/172 |
| 8,552,781 B2 | 10/2013 | Mosalikanti et al. | | |
| 8,570,084 B2* | 10/2013 | Lin | ........... | H03K 5/1565 327/172 |
| 10,033,520 B2 | 7/2018 | Garg et al. | | |
| 10,038,433 B2* | 7/2018 | Cho | ........... | H03K 5/1565 |
| 2012/0019299 A1* | 1/2012 | McLeod | ........... | H03K 5/1565 327/175 |

* cited by examiner

*Primary Examiner* — Thomas J. Hiltunen
(74) *Attorney, Agent, or Firm* — Winston Hsu

(57) ABSTRACT

A calibration circuit, including a duty cycle correction circuit and a phase correction circuit and associated calibrating method, are provided. Firstly, a first duty cycle adjusted clock and a second duty cycle adjusted clock are generated by the duty cycle correction circuit based on a first input clock and a second input clock, respectively. Then, a first delay adjusted clock and a second delay adjusted clock are generated by the phase correction circuit based on a phase of the first duty cycle adjusted clock, and a detection signal is generated. The detection signal is related to a duty cycle of the first input clock, a duty cycle of the second input clock, and a phase difference between the second delay adjusted clock and the first delay adjusted clock. Later, the duty cycle correction circuit and the phase correction circuit are controlled in response to the detection signal.

20 Claims, 10 Drawing Sheets

CALIBRATION CIRCUIT AND ASSOCIATED CALIBRATING METHOD CAPABLE OF PRECISELY ADJUSTING CLOCKS WITH DISTORTED DUTY CYCLES AND PHASES

TECHNICAL FIELD

The disclosure relates in general to a calibration circuit, and associated calibrating method, and more particularly to a calibration circuit and associated calibrating method capable of adjusting clocks whose duty cycles and/or phases are distorted in transmission paths.

BACKGROUND

In the high speed Serializer/Deserializer (SerDes) circuit, clock signals received by the receiver is embedded with the data, and a clock data recovery circuit (CDR) is adapted to recover the clock signals.

FIG. 1 is a schematic diagram illustrating clocks, outputted by the clock-data recovery (CDR) circuit, are distorted during the transmission paths between the CDR and the sampling module. The CDR 11 receives the data signal (DATA) and, based on which the recovered clocks (errCLK_cdr, datCLK_cdr, edgCLK_cdr) are generated. The recovered clocks (errCLK_cdr, datCLK_cdr, edgCLK_cdr) are further transmitted to a sampling module 12. However, the clocks actually received by the sampling module 12 are distorted due to the transmission mismatch issues between the CDR and the sampling module 12. The clocks being distorted by the transmission paths 18a, 18b, 18c are defined as input clocks (errCLK_dist, datCLK_dist, edgCLK_dist) in the specification. Please refer to FIGS. 1 and 2 together.

FIG. 2 is a waveform diagram illustrating phase relationships between the recovered clocks (edgCLK_cdr, datCLK_cdr, errCLK_cdr), and phase relationships between the input clocks (edgCLK_dist, datCLK_dist, errCLK_dist). In FIG. 2, the dotted rectangle RCT1 shows the waveform of the data signal (DATA), the dotted rectangle RCT2 shows the waveforms of the recovered clocks (errCLK_cdr, datCLK_cdr, edgCLK_cdr), and the dotted rectangle RCT3 shows the waveforms of the input clocks (errCLK_dist, datCLK_dist, edgCLK_dist). The durations of cycles of the data signal (DATA), the recovered clocks (errCLK_cdr, datCLK_cdr, edgCLK_cdr), and the input clocks (errCLK_dist, datCLK_dist, edgCLK_dist) are equivalent.

As the recovered clocks (edgCLK_cdr, datCLK_cdr, errCLK_cdr) are directly generated by the CDR 11, their phase relationships can be precisely controlled. Please refer to the waveforms shown in the dotted rectangles RCT1, RCT2 together. The significant transitions (rising edges and falling edges) of the recovered clock (edgCLK_cdr) are aligned with the significant transitions of the data signal (DATA), and the significant transitions (rising edges and falling edges) of the recovered clocks (datCLK_cdr, errCLK_cdr) are targeted to the center of the data signal (DATA). Therefore, the phase difference between the recovered clocks (edgCLK_cdr, datCLK_cdr) is equivalent to 90 degrees, and the phase difference between the recovered clocks (edgCLK_cdr, errCLK_cdr) is equivalent to 90 degrees.

As shown in FIG. 1, input clocks (edgCLK_dist, datCLK_dist, errCLK_dist) have been transmitted through different transmission paths 18a, 18b, 18c, and routing mismatch and spatial mismatch exist between the CDR 11 and the sampling module 12. In consequence, the phase difference introduced by these transmission paths 18a, 18b, 18c are not equal, and the phase relationships between the input clocks (edgCLK_dist, datCLK_dist, errCLK_dist) are unlikely to be the same as the phase relationships between the recovered clocks (errCLK_cdr, datCLK_cdr, edgCLK_cdr). In the dotted rectangle RCT3, the input clocks (datCLK_dist, errCLK_dist) are shown in dotted lines to represent that some shifts may occur, and phases of the input clocks (datCLK_dist, errCLK_dist) may change.

Please refer to the waveforms shown in the dotted rectangles RCT1, RCT3 together. Although the rising edges and the falling edges of the input clock (edgCLK_dist) are aligned with the significant transitions of the data signal (DATA), the dotted waveforms of the input clocks (datCLK_dist, errCLK_dist) indicate that the significant transitions of the input clocks (datCLK_dist, errCLK_dist) are probably not aligned with the center of the data signal (DATA). Once the phase relationships between the input clocks (edgCLK_dist, datCLK_dist) are not maintained as the phase relationships of their corresponding recovered clocks (datCLK_cdr, edgCLK_cdr), the data carried by the data signal (DATA) cannot be correctly sampled. In other words, the timing margin in the data sampling is reduced, and the bit data rate of the SerDes circuit is endangered.

SUMMARY

The disclosure is directed to a calibration circuit and an associated calibrating method. By adapting the calibration circuit, which performs the calibrating method, phases of the clocks are precisely adjusted and ready to be sampled.

According to one embodiment, a calibration circuit is provided. The calibration circuit includes a duty cycle correction circuit, a phase correction circuit, a clock selection circuit, and a first control circuit (CTL1). The duty cycle correction circuit generates a first duty cycle adjusted clock (datCLK_dcc) based on a first input clock (datCLK_dist) and generates a second duty cycle adjusted clock (edgCLK_dcc) based on a second input clock (edgCLK_dist). The frequency of the first input clock (datCLK_dist) and the frequency of the second input clock (edgCLK_dist) are equivalent. The phase correction circuit is electrically connected to the duty cycle correction circuit. The phase correction circuit generates a first delay adjusted clock (datCLK_de) based on a phase of the first duty cycle adjusted clock (datCLK_dcc), and generates a second delay adjusted clock (edgCLK_de) based on a phase of the second duty cycle adjusted clock (edgCLK_dcc). The clock selection circuit is electrically connected to the phase correction circuit. The clock selection circuit generates a detection signal (Sdcd). The detection signal (Sdcd) is related to a duty cycle of the first input clock (datCLK_dist), a duty cycle of the second input clock (edgCLK_dist), and a phase difference between the second delay adjusted clock (edgCLK_de) and the first delay adjusted clock (datCLK_de). The first control circuit (CTL1) is electrically connected to the duty cycle correction circuit, the phase correction circuit, and the clock selection circuit. The first control circuit (CTL1) controls the duty cycle correction circuit and the phase correction circuit in response to the detection signal (Sdcd).

According to another embodiment, a calibrating method is provided. The calibrating method is applied to a calibration circuit including a duty cycle correction circuit and a phase correction circuit, and the calibrating method includes the following steps. Firstly, a first duty cycle adjusted clock (datCLK_dcc) and a second duty cycle adjusted clock (edgCLK_dcc) are generated by the duty cycle correction circuit based on a first input clock (datCLK_dist) and a second input clock (edgCLK_dist), respectively. The frequency of the first input clock (datCLK_dist) and the frequency of the second input clock (edgCLK_dist) are equivalent. Then, a first delay adjusted clock (datCLK_de) and a second delay adjusted clock (edgCLK_de) are generated by the phase correction circuit based on a phase of the first duty cycle adjusted clock (datCLK_dcc) and a phase of the second duty cycle adjusted clock (edgCLK_dcc), respectively. Moreover, a detection signal (Sdcd) is generated. The detection signal (Sdcd) is related to a duty cycle of the first input clock (datCLK_dist), a duty cycle of the second input clock (edgCLK_dist), and a phase difference between the second delay adjusted clock (edgCLK_de) and the first delay adjusted clock (datCLK_de). Later, the duty cycle correction circuit and the phase correction circuit are controlled in response to the detection signal (Sdcd).

Figure 1:
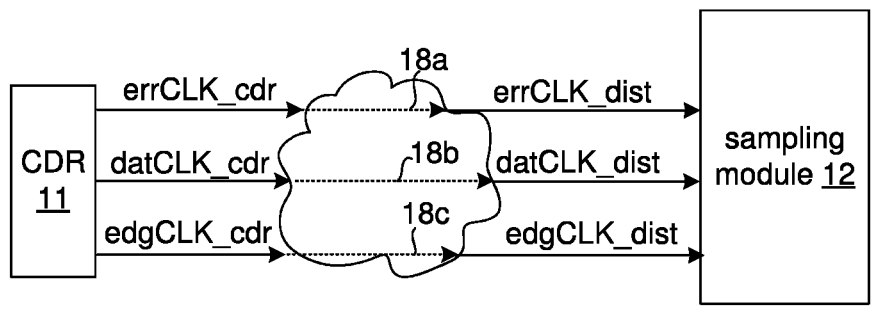
FIG. 1 (prior art) is a schematic diagram illustrating clocks, outputted by the CDR, are distorted during the transmission path between CDR and the sampling module.
Figure 2:
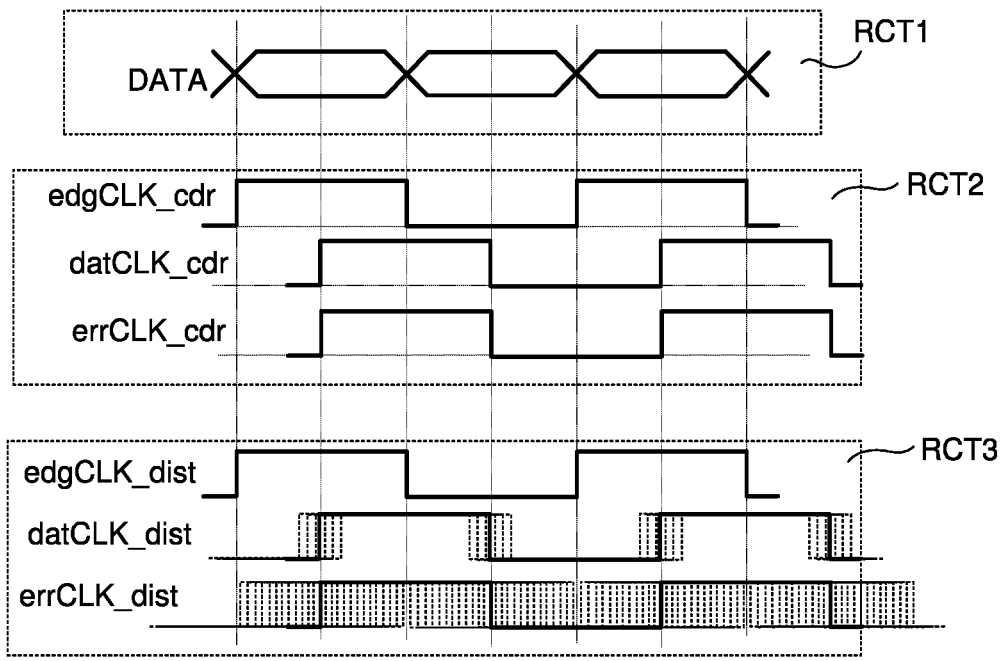
FIG. 2 (prior art) is a waveform diagram illustrating the phase relationships between the recovered clocks (edgCLK_cdr, datCLK_cdr, errCLK_cdr), and the phase relationships between the input clocks (edgCLK_dist, datCLK_dist, errCLK_dist).

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown the simplify the drawing.

DETAILED DESCRIPTION

As illustrated above, the phase relationships between the input clocks (edgCLK_dist, datCLK_dist, errCLK_dist) are not as ideal as with the phase relationships between the recovered clocks (edgCLK_cdr, datCLK_cdr, errCLK_cdr) due to the mismatches of the transmission paths 18a, 18b, 18c. To ensure that the sampling circuit can receive clock signals having correct phase relationships, a calibration circuit is provided. The calibration circuit is placed in between the CDR and the sampling module so that the distortion caused by the transmission mismatch can be calibrated before the sampling circuit performs the sampling operation.

Figure 3:
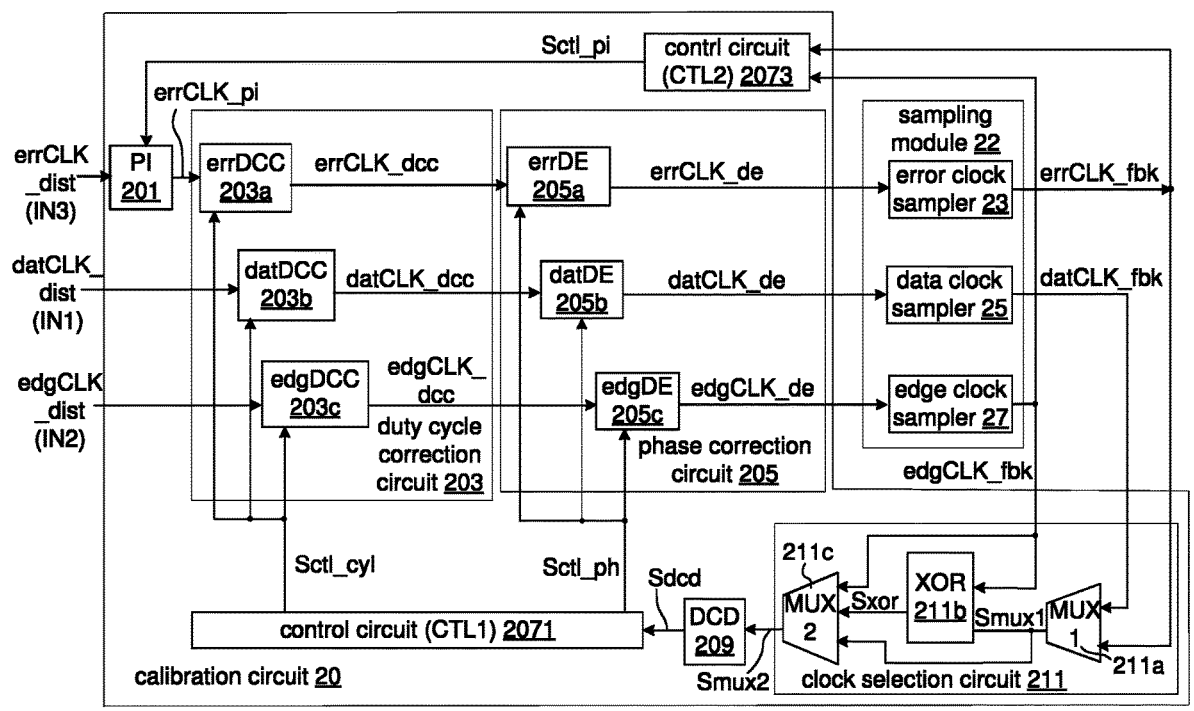
FIG. 3 is a block diagram illustrating the calibration circuit according to the embodiment of the present disclosure.

FIG. 3 is a block diagram illustrating the calibration circuit according to the embodiment of the present disclosure. The sampling module 22 includes an error clock sampler 23, a data clock sampler 25, and an edge clock sampler 27. Each of the error clock sampler 23, the data clock sampler 25, and the edge clock sampler 27 includes an input circuit, a sense amplifier (SA), and a decision feedback equalizer (DFE).

After receiving the input clocks (errCLK_dist, datCLK_dist, edgCLK_dist), the calibration circuit 20 calibrates their duty cycles and phase and the calibration circuit 20 accordingly generates their corresponding delay adjusted clocks (errCLK_de, datCLK_de, edgCLK_de), respectively. Based on the adjusted clocks (errCLK_de, datCLK_de, edgCLK_de), the sampling module 22 generates sampling clocks (errCLK_smp, datCLK_smp, edgCLK_smp) and feedback clocks (errCLK_fbk, datCLK_fbk, edgCLK_fbk).

The sampling clocks (errCLK_smp, datCLK_smp, edgCLK_smp) are respectively synchronized with their corresponding feedback clocks (errCLK_fbk, datCLK_fbk, edgCLK_fbk). Basically, the sampling clocks (errCLK_smp, datCLK_smp, edgCLK_smp) are utilized for sampling, and the feedback clocks (errCLK_fbk, datCLK_fbk, edgCLK_fbk) are generated for calibration.

Figure 4A:
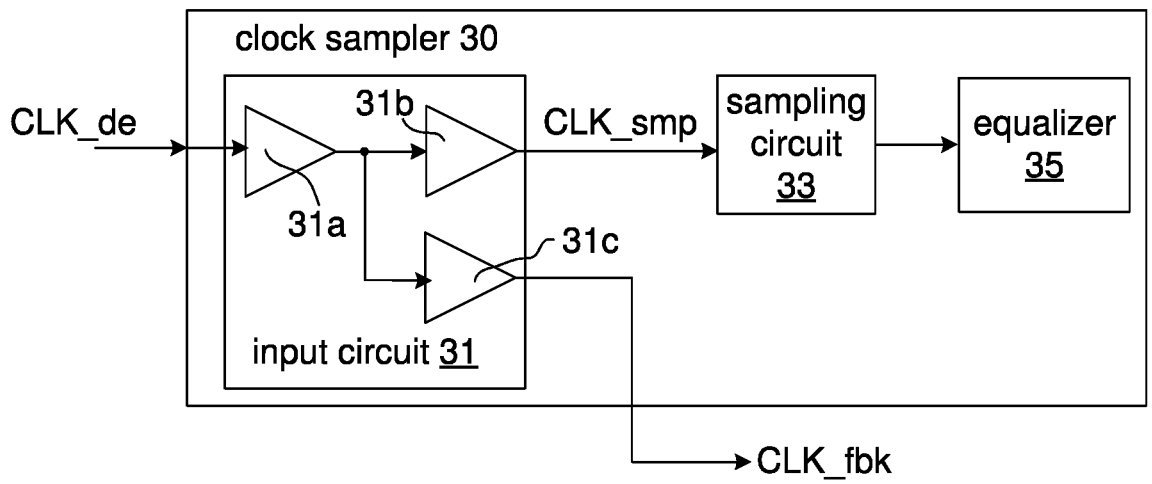
FIG. 4A is a schematic diagram illustrating the internal connections of an exemplary clock sampler.
Figure 4B:
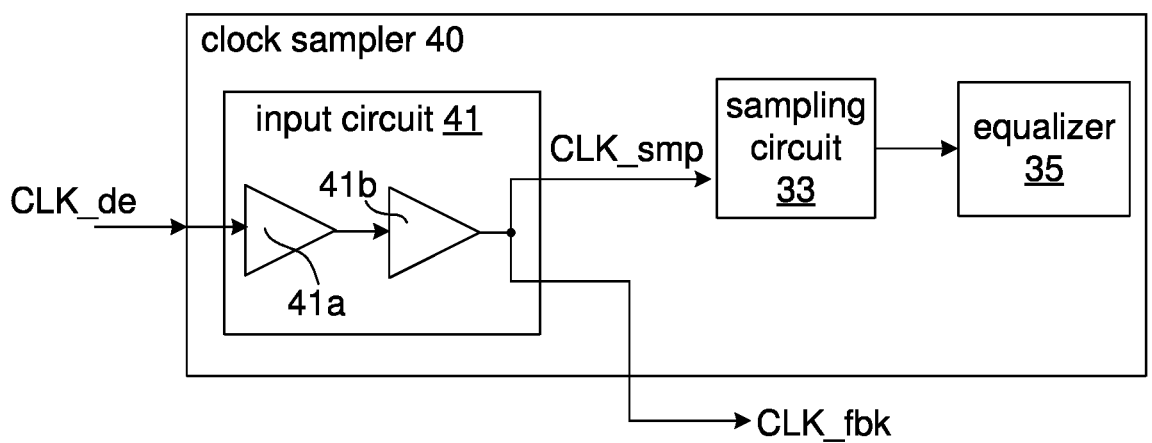
FIG. 4B is a schematic diagram illustrating the internal connections of another exemplary clock sampler.

The error clock sampler 23, the data clock sampler 25, and the edge clock sampler 27 respectively use their corresponding sampling clocks (errCLK_smp, datCLK_smp, edgCLK_smp) to perform the sampling and the equalization. Examples about implementations of the error clock sampler 23, the data clock sampler 25, and the edge clock sampler 27 are shown in FIGS. 4A and 4B. Detail illustrations about the samplings and the equalizations performed by the error clock sampler 23, the data clock sampler 25, and the edge clock sampler 27 are not described.

The internal components of the calibration circuit 20 and their corresponding signals are illustrated. The calibration circuit 20 includes a phase interpolator (PI) 201, a duty cycle correction circuit 203, a phase correction circuit 205, control circuits (CTL1) 2071, (CTL2) 2073, a duty cycle detector (DCD) 209, and a clock selection circuit 211. The control circuits (CTL1) 2071, (CTL2) 2073 are respectively related to different control flows, and their physical implementation can be integrated together. The phase interpolator 201 is electrically connected to the control circuit (CTL2) 2073. The duty cycle correction circuit 203 is electrically connected to the phase interpolator 201, the phase correction circuit 205, and the control circuits 2071, 2073. The phase correction circuit 205 is electrically connected to the control circuit (CTL1) 2071 and the sampling module 22. The duty cycle detector (DCD) 209 is electrically connected to the control circuit (CTL1) 2071 and the clock selection circuit 211.

The duty cycle correction circuit 203 includes duty cycle correctors (errDCC) 203a, (datDCC) 203b, (edgDCC) 203c, and the phase correction circuit 205 includes delay circuits (errDE) 205a, (datDE) 205b, (edgDE) 205c. The duty cycle corrector (errDCC) 203a is electrically connected to the phase interpolator 201 and the phase correction circuit 205. The duty cycle correctors (datDCC) 203b, (edgDCC) 203c are electrically connected to the phase correction circuit 205. The duty cycle correctors (errDCC) 203a, (datDCC) 203b, (edgDCC) 203c are electrically connected to the control circuit (CTL1) 2071.

The phase correction circuit 205 further includes delay circuits (errDE) 205a, (datDE) 205b, (edgDE) 205c. The delay circuit (errDE) 205a is electrically connected to the duty cycle corrector (errDCC) 203a, and the error clock sampler 23. The delay circuit (datDE) 205b is electrically connected to the duty cycle corrector (datDCC) 203b and the data clock sampler 25. The delay circuit (edgDE) 205c is electrically connected to the duty cycle corrector (edgDCC) 203c and the edge clock sampler 27. The delay circuits (errDE) 205a, (datDE) 205b, (edgDE) 205c are electrically connected to the control circuit (CTL1) 2071.

The clock selection circuit 211 further includes clock selectors 211a, 211c, and a comparison circuit 211b. In the specification, it is assumed that the clock selectors 211a, 211c are implemented with multiplexers (MUX1, MUX2), and the comparison circuit 211b is implemented with an exclusive-or (XOR) gate. The practical designs of the clock selectors 211a, 211c, and the comparison circuit 211 should not be limited to these examples. The clock selector (MUX1) 211a is electrically connected to the error clock sampler 23, the control circuit (CTL2) 2073, the data clock sampler 25, the comparison circuit (XOR) 211b, and the clock selector (MUX2) 211c. The comparison circuit (XOR) 211b is electrically connected to the edge clock sampler 27, the control circuit (CTL2) 2073, the clock selector (MUX1) 211a, and the clock selector (MUX2) 211c. The clock selector (MUX2) 211c is electrically connected to the edge clock sampler 27, the control circuit (CTL2) 2073, the comparison circuit (XOR) 211b, and the duty cycle detector (DCD) 209.

In the specification, an error-clock calibration path related to calibrating the input clock (errCLK_dist), a data-clock calibration path related to calibration of the input clock (datCLK_dist), and an edge-clock calibration path related to calibration of the input clock (edgCLK_dist) are respectively defined. In addition, a collective path related to all the input clocks (errCLK_dist, datCLK_dist, edgCLK_dist) is defined. The signals related to the error-clock calibration path, the data-clock calibration path, the edge-clock calibration path, and the collective path are respectively introduced below.

The error-clock calibration path includes the control circuit (CTL2) 2073, the phase interpolator 201, the duty cycle corrector (errDCC) 203a, the delay circuit (errDE) 205a, and the error clock sampler 23. The signals related to the error-clock calibration path are summarized in Table 1.

TABLE 1

| signal | name | meaning/definition |
| --- | --- | --- |
| errCLK_dist | input clock | error clock received by calibration circuit |
| errCLK_pi | phase interpolated error clock | error clock generated by phase interpolator |
| errCLK_dcc | duty cycle adjusted clock | error clock outputted by duty cycle corrector (errDCC) |
| errCLK_de | delay adjusted clock | error clock outputted by delay circuit (errDE) |
| errCLK_fbk | feedback clock | error clock outputted by error clock sampler |

The data-clock calibration path includes the duty cycle corrector (datDCC) 203b, the delay circuit (datDE) 205b, and the data clock sampler 25. The signals related to the data-clock calibration path are summarized in Table 2.

TABLE 2

| signal | name | meaning/definition |
| --- | --- | --- |
| datCLK_dist | input clock | data clock received by calibration circuit |
| datCLK_dcc | duty cycle adjusted clock | data clock outputted by duty cycle corrector (datDCC) |
| datCLK_de | delay adjusted clock | data clock outputted by delay circuit (datDE) |
| datCLK_fbk | feedback clock | data clock outputted by data clock sampler |

The edge-clock calibration path includes the duty cycle corrector (edgDCC) 203c, the delay circuit (edgDE) 205c, and the edge clock sampler 27. The signals related to the edge-clock calibration path are summarized in Table 3.

TABLE 3

| signal | name | Meaning/definition |
| --- | --- | --- |
| edgCLK_dist | input clock | edge clock received by calibration circuit |
| edgCLK_dcc | duty cycle adjusted clock | edge clock outputted by duty cycle corrector (datDCC) |
| edgCLK_de | delay adjusted clock | edge clock outputted by delay circuit (datDE) |
| edgCLK_fbk | feedback clock | edge clock outputted by edge clock sampler |

The collective path includes the clock selection circuit 211, the duty cycle detector (DCD) 209, and the control circuit (CTL1) 2071. The signals being transmitted in the collective path and their related circuits are respectively defined below.

TABLE 4

| related circuit | signal | name | Meaning/definition |
|---|---|---|---|
| control circuit (CTL1) | Sctl_cyl | duty cycle control signal | control signal generated by control circuit CTL1 to set duty cycle correctors (errDCC/datDCC/edgDCC) so that duty cycles of duty cycle adjusted clocks (errCLK_dcc/datCLK_dcc/edgCLK_dcc) are adjusted accordingly. |
|  | Sctl_ph | phase control signal | control signal generated by control circuit (CTL1) to set delay circuits (errDE/datDE/edgDE) so that phases of delay adjusted clocks (errCLK_de/datCLK_de/edgCLK_de) are adjusted accordingly. |
| duty cycle detector (DCD) | Sdcd | duty cycle detection signal | output of duty cycle detector (DCD). Representing duty cycle of selected signal (Smux2) is higher than, equivalent to, or lower than 50%. |
| clock selector (MUX2) | Smux2 | selected signal | output of clock selector (MUX2). Equivalent to one of feedback clock (edgCLK_fbk), comparison signal Sxor, and selected signal (Smux1). |
| comparison circuit (XOR) | Sxor | comparison signal | output of comparison circuit (XOR). Generated based on feedback clock (edgCLK_fbk) and selected signal (Smux1). |
| clock selector (MUX1) | Smux1 | selected signal | output of clock selector MUX1. Equivalent to one of feedback clocks (errCLK_fbk), (datCLK_fbk). |
| control circuit (CTL2) | Sctl_pi | control signal of phase interpolator (PI) | control signal generated by control circuit (CTL2) to set phase interpolator, so that phase of phase interpolated error clock (errCLK_pi) is adjusted accordingly |

The error clock sampler 23, the data clock sampler 25, and the edge clock sampler 27 can be implemented in a similar manner. Exemplary implementations of the clock sampler, which can be adapted for the error clock sampler 23, the data clock sampler 25, and the edge clock sampler 27 are illustrated in FIGS. 4A and 4B.

In FIGS. 4A and 4B, the delay adjusted clock CLK_de may represent any of the delay adjusted clocks (errCLK_de, datCLK_de, edgCLK_de), the sampling clock CLK_smp may represent any of the sampling clocks errCLK_smp, datCLK_smp, edgCLK_smp, and the feedback clock CLK_fbk may represent any of the feedback clocks (errCLK_fbk, datCLK_fbk, edgCLK_fbk). It should be noted that practical design of the error clock sampler 23, the data clock sampler 25, and the edge clock sampler 27 are not be limited to the examples shown in FIGS. 4A and 4B.

FIG. 4A is a schematic diagram illustrating the internal connections of an exemplary clock sampler. In FIG. 4A, the clock sampler 30 includes an input circuit 31 having buffers 31a, 31b, 31c, a sampling circuit 33, and an equalizer 35. The buffer 31a is electrically connected to the buffers 31b, 31c. The sampling circuit 33 is electrically connected to the buffer 31b and the equalizer 35.

The input circuit 31 receives the delay adjusted clock CLK_de and generates the sampling clock CLK_smp and the feedback clock CLK_fbk simultaneously. The buffer 31a receives the delay adjusted clock CLK_de and transmits its output to the buffers 31b, 31c. Then, the buffer 31b outputs the sampling clock CLK_smp, and the buffer 31c outputs the feedback clock CLK_fbk. The buffers 31b, 31c are assumed to be replica circuits, so the sampling clock CLK_smp outputted by the buffer 31b and the feedback clock CLK_fbk outputted by the buffer 31c have synchronized phases and identical duty cycles.

According to the embodiment of the present disclosure, once the calibration circuit 20 is adapted, phases and duty cycles of the feedback clock CLK_fbk are calibrated. Consequentially, the sampling clock CLK_smp also has a precise phase and duty cycle as it is perfectly synchronized with the precise feedback clock CLK_fbk.

FIG. 4B is a schematic diagram illustrating the internal connections of another exemplary clock sampler. In FIG. 4B, the clock sampler 40 includes an input circuit 41 having buffers 41a, 41b, a sampling circuit 33, and an equalizer 35. The sampling circuit 33 is electrically connected to the buffer 41b and the equalizer 35.

The input circuit 41 receives the delay adjusted clock CLK_de and generates the sampling clock CLK_smp and the feedback clock CLK_fbk simultaneously. The buffer 41a receives the delay adjusted clock CLK_de and transmits its output to the buffer 41b. Then, the output of the buffer 41b is simultaneously utilized as both the sampling clock CLK_smp and the feedback clock CLK_fbk. Therefore, the sampling clock CLK_smp and the feedback clock CLK_fbk have synchronized phases and identical duty cycles.

According to the embodiment of the present disclosure, once the calibration circuit 20 is adapted, phases and duty cycles of the feedback clock CLK_fbk have been calibrated. Consequentially, the sampling clock CLK_smp also has a precise phase and duty cycle as it is perfectly synchronized with the precise feedback clock CLK_fbk.

Figure 5:
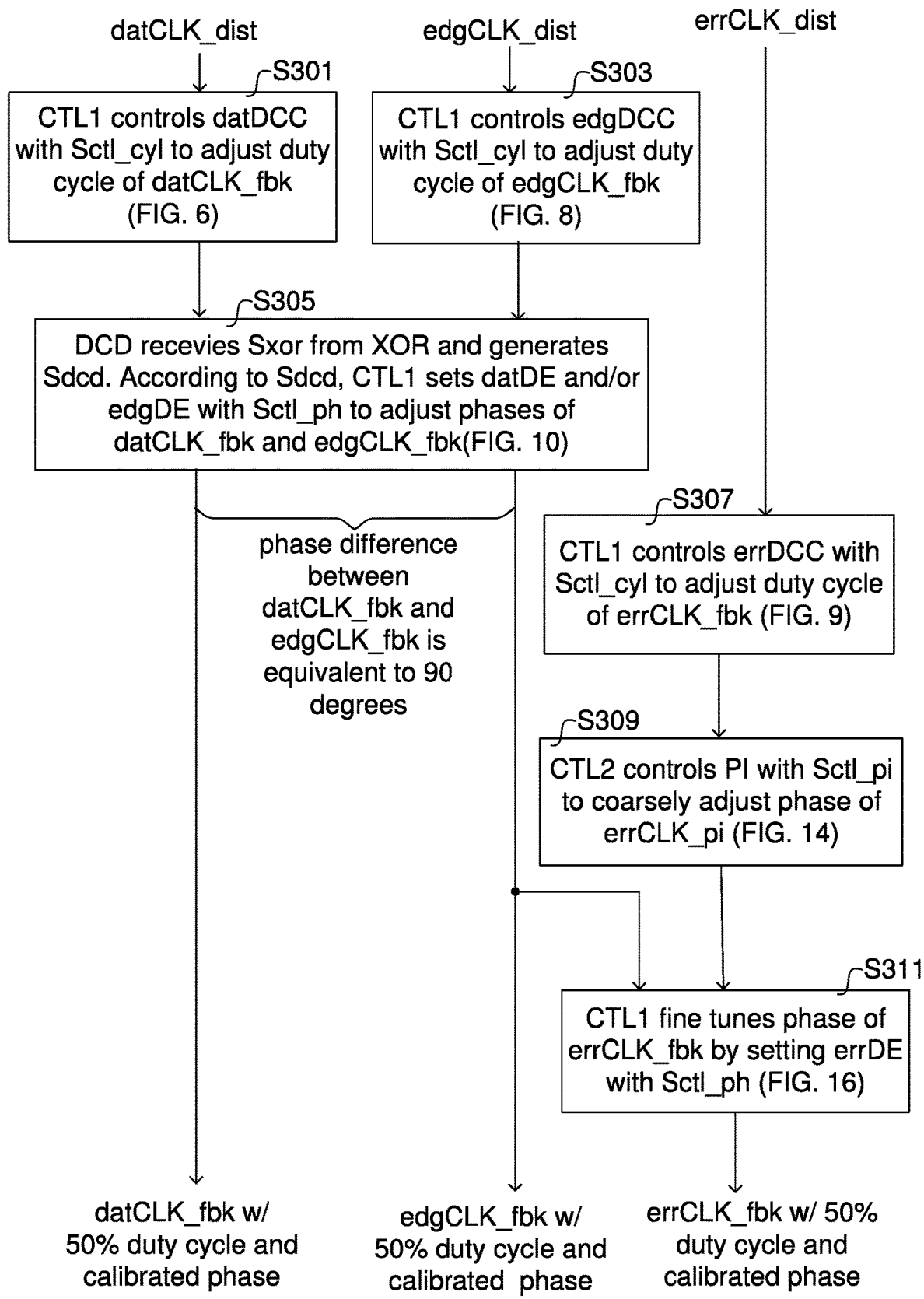
FIG. 5 is a flow diagram schematically illustrating the operation of the calibration circuit.

FIG. 5 is a flow diagram schematically illustrating the operation of the calibration circuit. The operation of the calibration circuit 20 involves three-branch flows. A left branch flow is related to how the duty cycle and the phase of the input clock (datCLK_dist) are calibrated to generate the feedback clock (datCLK_fbk). A middle branch flow is related to how the duty cycle and the phase of the input clock (edgCLK_dist) are calibrated to generate the feedback clock (edgCLK_fbk). A right branch flow is related to how the duty cycle and the phase of the input clock (errCLK_dist) are calibrated to generate the feedback clock (edgCLK_fbk).

Firstly, the control circuit (CTL1) 2071 controls the duty cycle corrector (datDCC) 203b with the duty cycle control signal (Sctl_cyl) to adjust the duty cycle of the duty cycle adjusted clock (datCLK_dcc) (step S301), and the control circuit (CTL1) 2071 controls the duty cycle corrector edgDCC with the duty cycle control signal (Sctl_cyl) to adjust the duty cycle of the duty cycle adjusted clock (edgCLK_dcc) (step S303). As the duty cycle adjusted clock (datCLK_dcc) is further transmitted to and utilized by the delay circuit (datDE) and the data clock sampler 25, the duty cycles of the delay adjusted clock (datCLK_de) and the feedback clock (datCLK_fbk) are also adjusted after step S301. Similarly, as the duty cycle adjusted clock (edgCLK_dcc) is further transmitted to and utilized by the delay circuit (edgDE) and the edge clock sampler 27, the duty cycles of the delay adjusted clock (edgCLK_de) and the feedback clock (edgCLK_fbk) are also adjusted after step S303.

Please notice that, as the delay circuit (datDE) 205b and the buffer in the data clock sampler 25 might also respectively introduce different variations to the duty cycle of the clock signals (datCLK), the duty cycles of the duty cycle adjusted clock (datCLK_dcc), the delay adjusted clock (datCLK_de), and the feedback clock datCLK_fbk are not necessary to be equivalent. In other words, after calibration, the duty cycles of the duty cycle adjusted clock (dat- CLK_dcc), the delay adjusted clock (datCLK_de) might not be equivalent to 50%, though the duty cycle of the feedback clock (datCLK_fbk) has been precisely corrected to 50%.

Similarly, as the delay circuit (edgDE) 205c and the buffer in the edge clock sampler 27 might also respectively introduce different variations to the duty cycle of the clock signals (edgCLK), the duty cycles of the duty cycle adjusted clock (edgCLK_dcc), the delay adjusted clock (edgCLK_de), and the feedback clock (edgCLK_fbk) are not necessary to be equivalent. In other words, after calibration, the duty cycles of the duty cycle adjusted clock (edgCLK_dcc), the delay adjusted clock (edgCLK_de) might not be equivalent to 50%, though the duty cycle of the feedback clock (edgCLK_fb) has been precisely corrected to 50%.

Then, the comparison circuit (XOR) 211b generates the comparison signal Sxor to the duty cycle detector (DCD) 209, and the duty cycle detector (DCD) 209 generates a duty cycle detection signal (Sdcd) to the control circuit (CTL1) 2071. Based on the duty cycle detection signal (Sdcd), the control circuit (CTL1) 2071 is aware of the phase relationship between the feedback clocks (edgCLK_fbk, datCLK_fbk).

Then, the control circuit (CTL1) accordingly sets the delay circuit (datDE) 205b with the phase control signal (Sctl_ph) to adjust phase of the delay adjusted clock (datCLK_de) and sets the delay circuit (edgDE) 205c with the phase control signal (Sctl_ph) to adjust phase of the delay adjusted clock (edgCLK_de) (step S305). After step S305, the feedback clocks (datCLK_fbk and edgCLK_fbk) are 90 degrees in phase.

Please notice that, as the data clock sampler 25 might alter phase along the data-clock calibration path, and the edge clock sampler 27 might alter phase of edge-clock calibration path, phase difference between the delay adjusted clocks (datCLK_de and the edgCLK_de) might not be equivalent to the phase difference between the feedback clocks (datCLK_fbk and edgCLK_fbk). That is, the phase difference between the delay adjusted clocks (datCLK_de and the edgCLK_de) might be greater than or less than 90 degrees.

Steps S301, S303, and S305 are related to how the duty cycles and phases of the feedback clocks (datCLK_fbk and edgCLK_fbk) are calibrated. Steps S307, S309, and S311 are related to how the duty cycle and the phase of the feedback clock (errCLK_fbk) are calibrated.

The control circuit (CTL1) 2071 controls the duty cycle corrector (errDCC) 203c to adjust the duty cycle of the delay adjusted clock (errCLK_de) (step S307), based on a similar scheme explained in steps S301 and S303. After step S307, the feedback clock (errCLK_fbk) is with a duty cycle equivalent to 50%.

Figure 15:
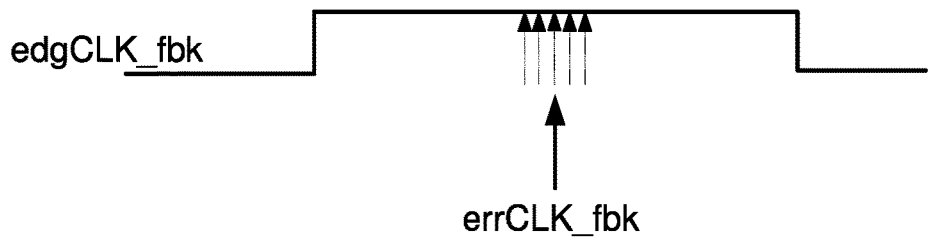
FIG. 15 is a schematic diagram illustrating that the rising edges of the feedback clock (errCLK_fbk) are repetitively used to sample the state of the feedback clock (edgCLK_fbk) after the phase of the feedback clock (errCLK_fbk) has been coarsely adjusted.

Then, the calibration of the phase of the input clock (errCLK_dist) is performed in a two-stage-manner. In step S309, the control circuit (CTL2) 2073 controls setting values of the phase interpolator (PI) 201 to coarsely adjust the phase of the phase interpolated error clock (errCLK_pi) (step S309). In consequence, the phase of the duty cycle adjusted clock (errCLK_dcc), the phase of the delay adjusted clock (errCLK_de), and the phase of the feedback clock (errCLK_fbk) are also changed (FIG. 15).

Moreover, based on a comparison of the delay adjusted clocks (edgCLK_de, errCLK_de), the control circuit (CTL1) 2071 further fine tunes phases of the feedback clock (errCLK_fbk), by setting the delay circuit (errDE) with the phase control signal (Sctl_ph) (step S311). More details about how the components in the calibration circuit 20 execute steps shown in FIG. 5 are illustrated below.

Figure 6:
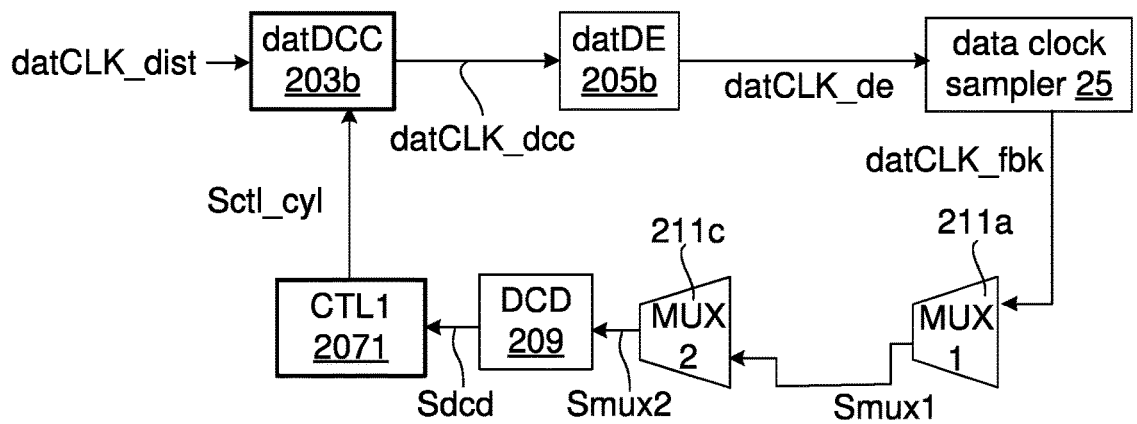
FIG. 6 is a schematic diagram illustrating the components in the calibration circuit, which are related to the duty cycle correction of the input clock (datCLK_dist).

FIG. 6 is a schematic diagram illustrating the components in the calibration circuit, which are related to the duty cycle correction of the input clock (datCLK_dist). FIG. 6 is corresponding to the step S301 in FIG. 5.

The duty cycle corrector (datDCC) 203b receives the input clock (datCLK_dist) and generates the duty cycle adjusted clock (datCLK_dcc), and the delay circuit (datDE) 205b receives the duty cycle adjusted clock (datCLK_dcc) to generate the delay adjusted clock (datCLK_de).

The clock selector (MUX1) 211a selects the feedback clock (datCLK_fbk) as its input and outputs the selected signal (Smux1) accordingly. The feedback clock (datCLK_fbk) is received from the data clock sampler 25. The clock selector (MUX2) 211c selects the selected signal (Smux1) as its input and outputs the selected signal (Smux2) accordingly.

Then, the duty cycle detector (DCD) 209 detects the duty cycle of the selected signal (Smux2) and generates the duty cycle detection signal (Sdcd). As the selected signal (Smux2) is originated from the feedback clock (datCLK_fbk) in FIG. 6, the duty cycle detection signal (Sdcd) actually represents the duty cycle of the feedback clock (datCLK_fbk).

According to the duty cycle detection signal (Sdcd), the control circuit (CTL1) 2071 is aware that the duty cycle of the input clock (datCLK_dist) is higher than, equivalent to, or lower than 50%. Thus, the control circuit (CTL1) 2071 generates the duty cycle control signal (Sctl_cyl) to adjust the setting of the duty cycle corrector (datDCC) 203b.

After the duty cycle corrector (datDCC) 203b changes its setting according to the duty cycle control signal (Sctl_cyl), the duty cycle of the duty cycle adjusted clock (datCLK_dcc) is changed, so as the duty cycles of the delay adjusted clock (datCLK_de) and the feedback clock (datCLK_fbk). Alternatively speaking, once the duty cycle corrector (datDCC) 203b receives the duty cycle control signal (Sctl_cyl), the duty cycles of the duty cycle adjusted clock (datCLK_dcc), the delay adjusted clock (datCLK_de), and the feedback clock (datCLK_fbk) are all adjusted accordingly.

Figure 7:
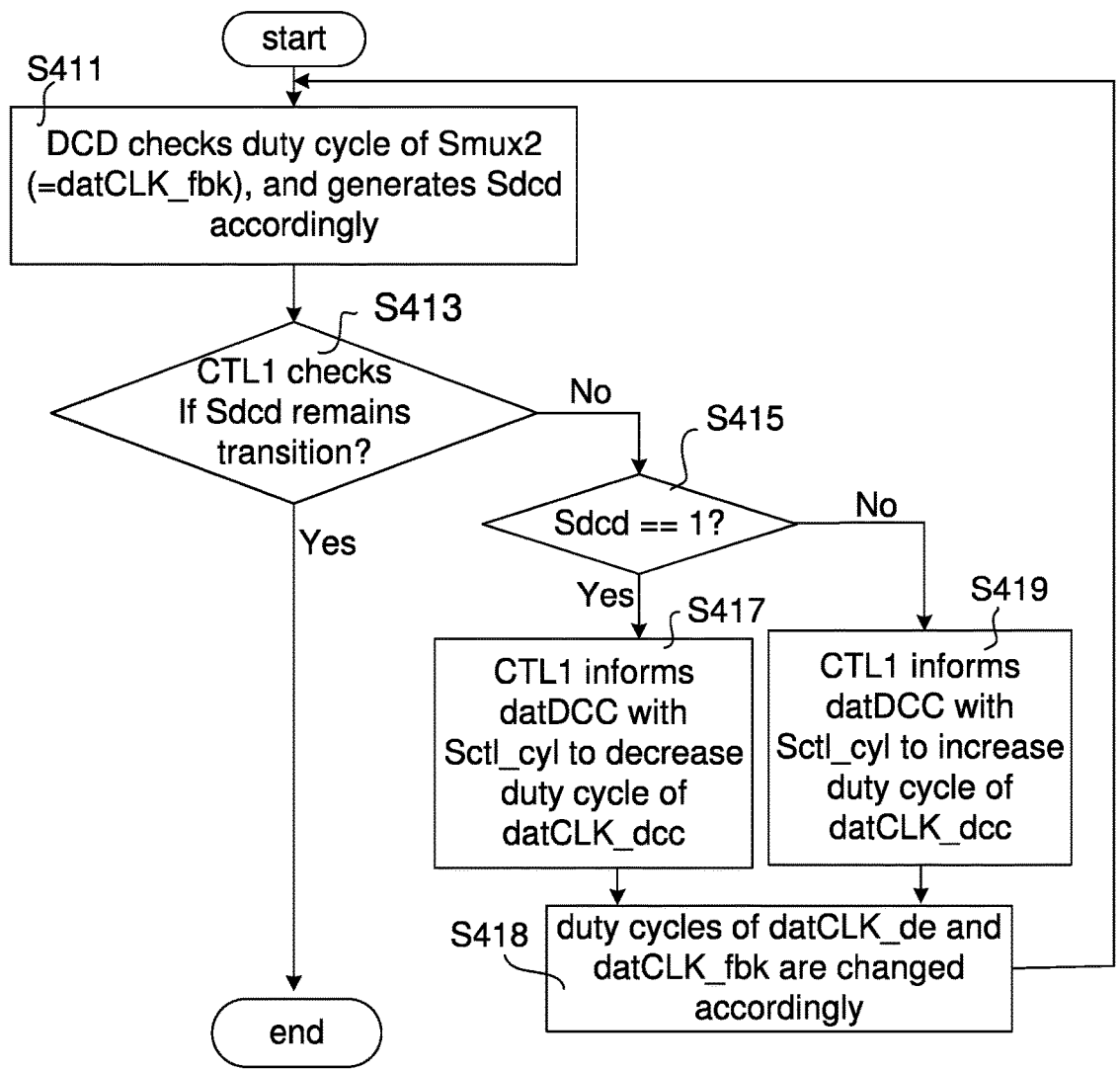
FIG. 7 is a flow diagram illustrating how the control circuit (CTL1) generates the duty cycle control signal (Sctl_cyl) to adjust the duty cycle of the delay adjusted clock (datCLK_de).

FIG. 7 is a flow diagram illustrating how the control circuit (CTL1) generates the duty cycle control signal (Sctl_cyl) to adjust the duty cycle of the delay adjusted clock (datCLK_de). The duty cycle detector (DCD) 209 checks the duty cycle of the selected signal (Smux2) and generates the duty cycle detection signal (Sdcd) (step S411). In the specification, the high logic level ("1") of the duty cycle detection signal (Sdcd) is assumed to represent that the duty cycle of the selected signal (Smux2) is higher than 50%, and the low logic level ("0") of the duty cycle detection signal (Sdcd) is assumed to represent that the duty cycle of the selected signal (Smux2) is lower than 50%.

Then, the control circuit (CTL1) 2071 checks if the duty cycle detection signal (Sdcd) keeps transit (step S413). If the determination result of step S413 is positive, the duty cycle of the selected signal (Smux2) is equivalent to 50%, the control circuit (CTL1) 2071 does not need to send the duty cycle control signal (Sctl_cyl), and the flow ends. On the other hand, if the determination result of step S413 is negative, the control circuit (CTL1) 2071 further determines whether the duty cycle detection signal (Sdcd) is at the high logic level ("1") (step S415).

If the determination result of step S415 is positive, the control circuit (CTL1) 2071 informs the duty cycle corrector (datDCC) 203b with the duty cycle control signal (Sctl_cyl) to decrease the duty cycle of the duty cycle adjusted clock (datCLK_dcc) (step S417). Alternatively, if the determination result of step S415 is negative, the control circuit (CTL1) 2071 informs the duty cycle corrector (datDCC) 203b with the duty cycle control signal (Sctl_cyl) to increase the duty cycle of the duty cycle adjusted clock (datCLK_dcc) (step S419).

After steps S417 and S419 are executed, the duty cycle of the delay adjusted clock (datCLK_de) and duty cycle of the feedback clock (datCLK_fbk) are changed accordingly (step S418) because the delay adjusted clock (datCLK_de) and the feedback clock (datCLK_fbk) are originated from the duty cycle adjusted clock (datCLK_dcc). Then, step S411 is executed again. The flow shown in FIG. 7 is repetitively performed until the determination result of step S413 is positive.

Figure 8:
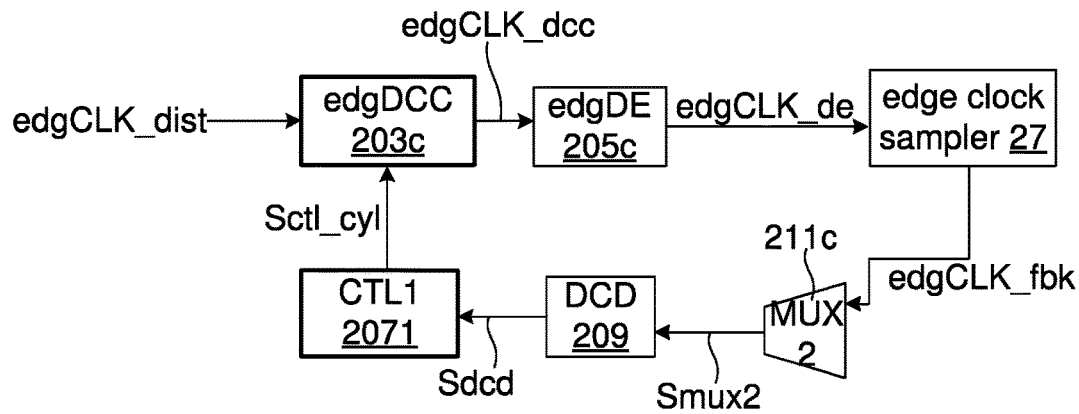
FIG. 8 is a schematic diagram illustrating the components in the calibration circuit, which are related to the duty cycle correction of the input clock (edgCLK_dist).

FIG. 8 is a schematic diagram illustrating the components in the calibration circuit, which are related to the duty cycle correction of the input clock (edgCLK_dist). FIG. 8 is corresponding to the step S303 in FIG. 5. The operations of FIG. 8 are similar to the ones shown in FIG. 6, except that different types of clocks are concerned. Similarly, the steps similar to the ones shown in FIG. 7 can be applied to FIG. 8. By the end of FIG. 8, the duty cycle of the feedback clock (edgCLK_fbk) is equivalent to 50%.

Figure 9:
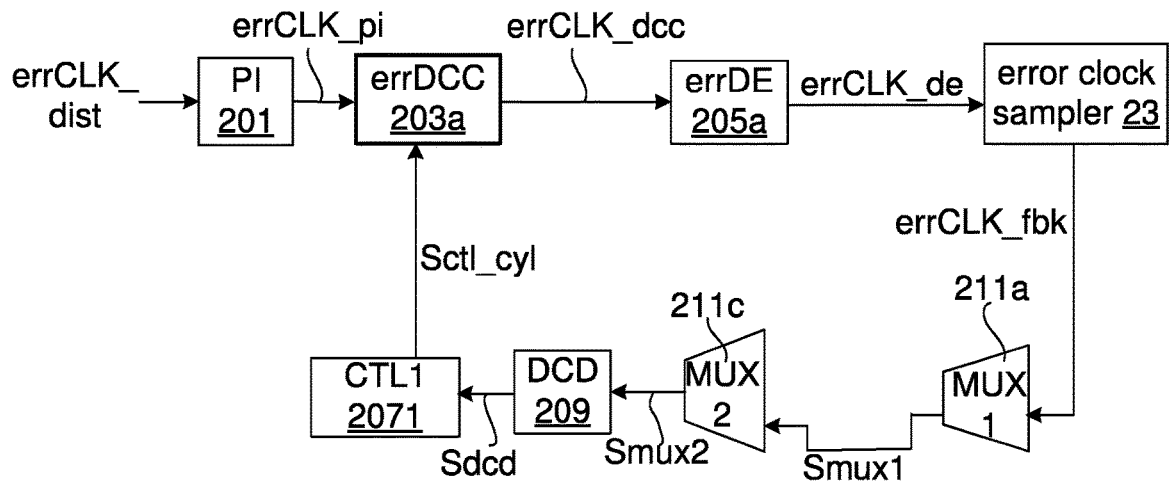
FIG. 9 is a schematic diagram illustrating the components in the calibration circuit, which are related to the duty cycle correction of the input clock (errCLK_dist).

FIG. 9 is a schematic diagram illustrating the components in the calibration circuit, which are related to the duty cycle correction of the delay adjusted clock (errCLK_de). FIG. 9 is corresponding to the step S307 in FIG. 5. The operations of FIG. 9 are similar to the ones shown in FIG. 6, except that the duty cycle corrector (errDCC) 203a receives its input, that is, the phase interpolated error clock (errCLK_pi), from the phase interpolator (PI) 201. Similarly, the steps similar to the ones shown in FIG. 7 can be applied to FIG. 9. By the end of FIG. 9, the duty cycle of the feedback clock (errCLK_fbk) is equivalent to 50%.

For the sake of comparison, the operations of FIGS. 6, 8, and 9 are summarized in Table 5.

TABLE 5

| step shown in FIG. 5 Related path | | step S301 data-clock calibration path | step S303 edge-clock calibration path | step S307 error-clock calibration path |
|---|---|---|---|---|
| related figure | | FIG. 6 | FIG. 8 | FIG. 9 |
| duty cycle of which signals being adjusted accordingly | | datCLK_dcc, datCLK_de, and datCLK_fbk | edgCLK_dcc, edgCLK_de, and edgCLK_fbk | errCLK_dcc, errCLK_de, and errCLK_fbk |
| origin of selected signal (Smux2) | | datCLK_fbk | edgCLK_fbk | errCLK_fbk |
| duty cycle detection signal (Sdcd) transits between "0" and "1" | duty cycle of selected signal (Smux2) = 50% | NA | NA | NA |
| duty cycle detection signal (Sdcd) = "0" | duty cycle of selected signal (Smux2) <50% | control circuit (CTL1) generates duty cycle control signal (Sctl_cyl) to increase duty cycle of duty cycle adjusted clock (datCLK_dcc) | control circuit CTL1 generates duty cycle control signal (Sctl_cyl) to increase duty cycle of duty cycle adjusted clock (edgCLK_dcc) | control circuit CTL1 generates duty cycle control signal (Sctl_cyl) to increase duty cycle of duty cycle adjusted clock (errCLK_dcc) |
| duty cycle detection signal (Sdcd) = "1" | duty cycle of selected signal (Smux2) >50% | control circuit (CTL1) generates duty cycle control signal (Sctl_cyl) to decrease duty cycle of duty cycle adjusted clock (datCLK_dcc) | control circuit (CTL1) generates duty cycle control signal (Sctl_cyl) to decrease duty cycle of duty cycle adjusted clock (edgCLK_dcc) | control circuit (CTL1) generates duty cycle control signal (Sctl_cyl) to decrease duty cycle of duty cycle adjusted clock (errCLK_dcc) |

As illustrated above, after steps 301, 303 are executed, the duty cycles of the feedback clock (datCLK_fbk, edgCLK_fbk) are both equivalent to 50%. Then, the phases of the feedback clock (datCLK_fbk, edgCLK_fbk) are adjusted to fulfill the requirement that the phase difference between the feedback clock (datCLK_fbk, edgCLK_fbk) should be 90 degrees.

Figure 10:
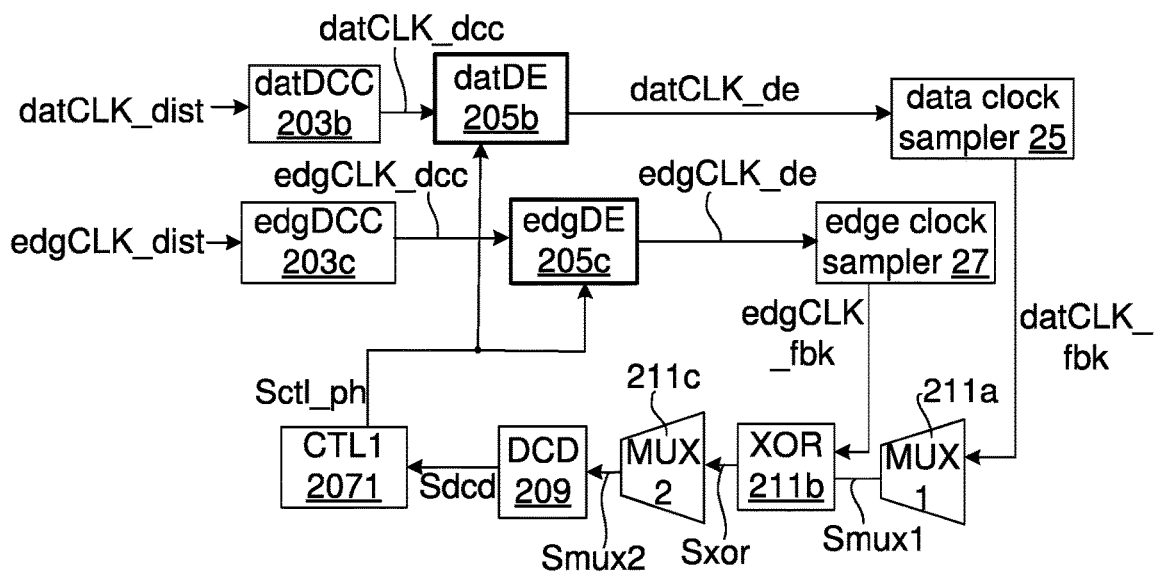
FIG. 10 is a schematic diagram illustrating the components in the calibration circuit, which are related to calibrating phase difference between the feedback clock (datCLK_fbk, edgCLK_fbk).

FIG. 10 is a schematic diagram illustrating the components in the calibration circuit, which are related to calibrating phase difference between the feedback clock (datCLK_fbk, edgCLK_fbk). FIG. 10 is corresponding to the step S305 in FIG. 5.

According to FIG. 10, the multiplexer (MUX1) 211a selects the feedback clock (datCLK_fbk) as its input. So, the selected signal (Smux1) is equivalent to the feedback clock (datCLK_fbk). Moreover, the comparison circuit (XOR) 211b receives the feedback clock (edgCLK_fbk) and the selected signal (Smux1) as its inputs. This implies that the comparison circuit (XOR) 211b generates its output (that is, the comparison signal (Sxor)) based on the feedback clocks (datCLK_fbk, edgCLK_fbk).

Figure 11A:
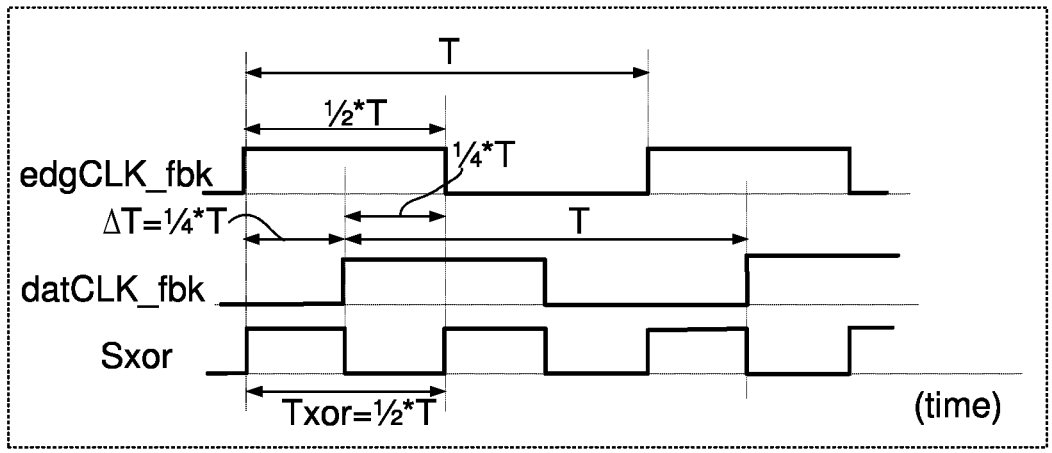
FIG. 11A is a waveform diagram illustrating the output of the comparison circuit when the phase difference between the feedback clocks (datCLK_fbk, edgCLk_fbk) is equivalent to 90 degrees.
Figure 11B:
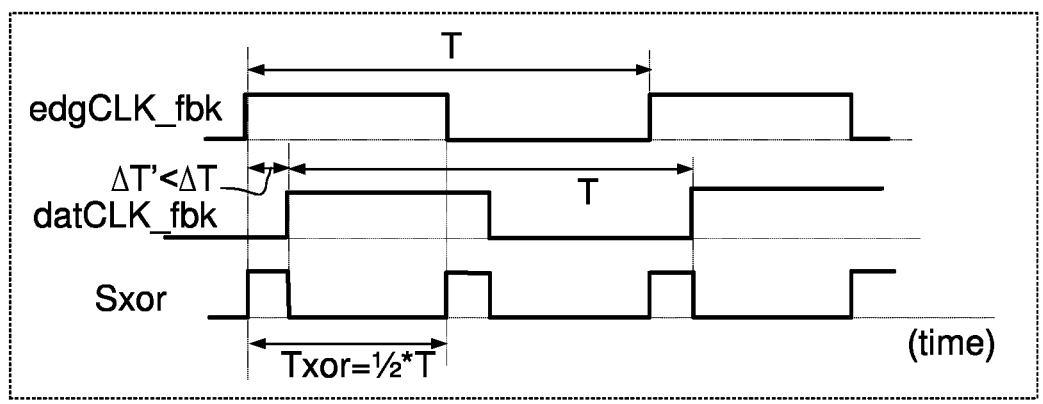
FIG. 11B is a waveform diagram illustrating the output of the comparison circuit when the phase difference between the feedback clocks (datCLK_fbk, edgCLk_fbk) is less than 90 degrees.
Figure 11C:
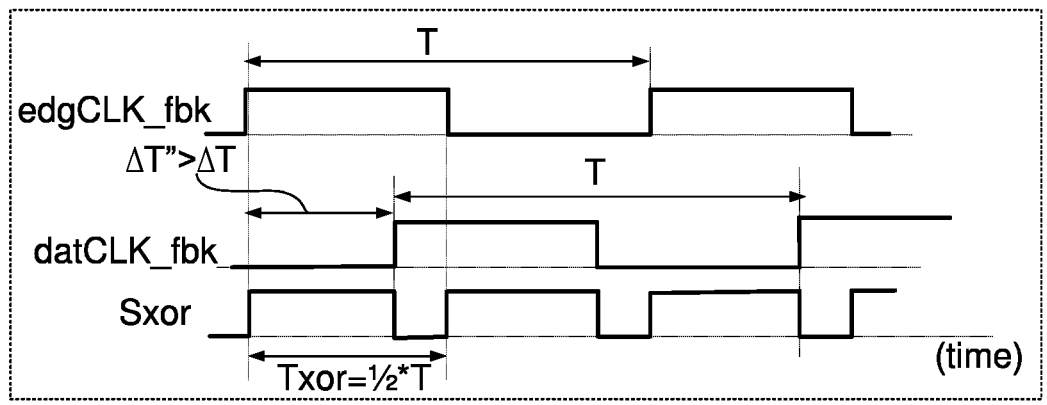
FIG. 11C is a waveform diagram illustrating the output of the comparison circuit when the phase difference between the feedback clocks (datCLK_fbk, edgCLk_fbk) is greater than 90 degrees.

In FIGS. 11A, 11B, and 11C, the horizontal axes represent time, and the vertical axes of FIGS. 11A, 11B, and 11C represent the comparison signals (Sxor) in different scenarios. The cycles of the feedback clocks (edgCLK_fbk, datCLK_fbk) are represented as "T," and the cycles of the comparison signals (Sxor) shown in FIGS. 11A, 11B, 11C are equivalent to half of the cycles of the feedback clocks (datCLK_fbk, edgCLk_fbk), that is, ½*T. In FIGS. 11A, 11B, and 11C, the comparison signal (Sxor) is equivalent to low logic level "0" when logic levels of the feedback clocks (datCLK_fbk, edgCLK_fbk) are the same, and the comparison signal (Sxor) is equivalent to high logic level "1" when logic levels of the feedback clocks (datCLK_fbk, edgCLK_fbk) are opposite.

FIG. 11A is a waveform diagram illustrating the output of the comparison circuit when the phase difference between the feedback clocks (datCLK_fbk, edgCLk_fbk) is equivalent to 90 degrees. In FIG. 11A, the time difference between the rising edges of the feedback clocks (datCLK_fbk, edgCLk_fbk) (ΔT) is equivalent to a quarter of the cycles of the feedback clocks (datCLK_fbk, edgCLK_fbk) (¼*T), that is, ΔT=¼*T. Alternatively speaking, the phase difference between the feedback clocks (datCLK_fbk, edgCLk_fbk) is equivalent to 90 degrees.

When the phase difference between the feedback clocks (datCLK_fbk, edgCLk_fbk) is equivalent to 90 degrees, the duration when the comparison signal (Sxor) is at the high logic level is equivalent to one quarter of the cycles of the feedback clocks (datCLK_fbk, edgCLk_fbk), that is, ΔT=¼*T. Therefore, the duty cycle of the comparison signal (Sxor) can be obtained by dividing the duration difference between the feedback clocks (datCLK_fbk, edgCLk_fbk) (¼*T) with the cycle of the comparison signal (Txor=½*T), that is, ΔT/Txor*100%=50%.

FIG. 11B is a waveform diagram illustrating the output of the comparison circuit when the phase difference between the feedback clocks (datCLK_fbk, edgCLk_fbk) is less than 90 degrees. In FIG. 11B, the time difference between the rising edges of the feedback clocks (datCLK_fbk, edgCLk_fbk) (ΔT') is shorter than a quarter of the duty cycles of the feedback clocks (datCLK_fbk, edgCLK_fbk) (¼*T), that is, ΔT'<¼*T. Alternatively speaking, the phase difference between the feedback clocks (datCLK_fbk, edgCLk_fbk) is less than 90 degrees.

When the phase difference between the feedback clocks (datCLK_fbk, edgCLk_fbk) is less than 90 degrees, the duration when the comparison signal (Sxor) is at the high logic level is shorter than one-quarter of the cycles of the feedback clocks (datCLK_fbk, edgCLk_fbk) (¼*T), that is ΔT'<ΔT=¼*T. Therefore, the duty cycle of the comparison signal (Sxor) can be obtained by dividing the duration difference between the feedback clocks (datCLK_fbk, edgCLk_fbk) (ΔT') with the cycle of the comparison signal (Txor=½*T), that is, ΔT'/Txor*100%<50%.

FIG. 11C is a waveform diagram illustrating the output of the comparison circuit when the phase difference between the feedback clocks (datCLK_fbk, edgCLk_fbk) is greater than 90 degrees. In FIG. 11C, the time difference between the rising edges of the feedback clocks (datCLK_fbk, edgCLk_fbk) (ΔT") is greater than a quarter of the duty cycles of the feedback clocks (datCLKibk, edgCLk_fbk) (¼*T), that is, ΔT">¼*T. Alternatively speaking, the phase difference between the feedback clocks (datCLK_fbk, edgCLk_fbk) is greater than 90 degrees.

When the phase difference between the feedback clocks (datCLK_fbk, edgCLk_fbk) is greater than 90 degrees, the duration when the comparison signal Sxor is at the high logic level ("1") is longer than one quarter of the cycles of the feedback clocks (datCLK_fbk, edgCLk_fbk) (¼*T), that is ΔT">T=¼*T. Therefore, the duty cycle of the comparison signal (Sxor) can be obtained by dividing the duration difference between the feedback clocks (datCLK_fbk, edgCLk_fbk) (ΔT") with the cycle of the comparison signal (Txor=½*T), that is, ΔT"/Txor*100%>50%.

As shown in FIGS. 11A, 11B, and 11C, the duty cycle of the comparison signal (Sxor) can be utilized to represent the phase difference between the feedback clocks (edgCLK_fbk, datCLK_fbk). As the clock selector (MUX2) 211c selects the comparison signal (Sxor) as its input in FIG. 10, the selected signal (Smux2) represents the phase difference between the feedback clocks (edgCLK_fbk, datCLK_fbk).

As illustrated above, the duty cycle detection signal (Sdcd) is equivalent to the high logic level "1" if the selected signal (Smux2) has a duty cycle higher than 50%, and the duty cycle detection signal (Sdcd) is equivalent to the low logic level "0" if the selected signal (Smux2) has a duty cycle lower than 50%. Therefore, the possible operations in FIG. 10 can be summarized in Table 6.

TABLE 6

| duty cycle detection signal (Sdcd) | duty cycle of selected signal (Smux2) | phase difference between the feedback clocks edgCLK_fbk, datCLK_fbk | related operations |
|---|---|---|---|
| duty cycle detection signal (Sdcd) transits between "0" and "1" | duty cycle of selected signal (Smux2) = 50% | 90 degrees | control circuit (CTL1) does not adjust any of delay circuit (datDE/edgDE) |
| duty cycle detection signal | duty cycle of selected signal | <90 degrees | control circuit (CTL1) sends phase control signal (Sctl_ph) to adjust |

TABLE 6-continued

| (Sdcd) = "0" | (Smux2) <50% | | delay circuit (datDE/edgDE) to increase phase difference between feedback clocks (edgCLK_fbk/datCLK_fbk) |
|---|---|---|---|
| duty cycle detection signal (Sdcd) = "1" | duty cycle of selected signal (Smux2) >50% | >90 degrees | control circuit (CTL 1) sends phase control signal (Sctl_ph) to adjust delay circuit (datDE/edgDE) to decrease phase difference between feedback clocks (edgCLK_fbk/datCLK_fbk) |

Figure 12:
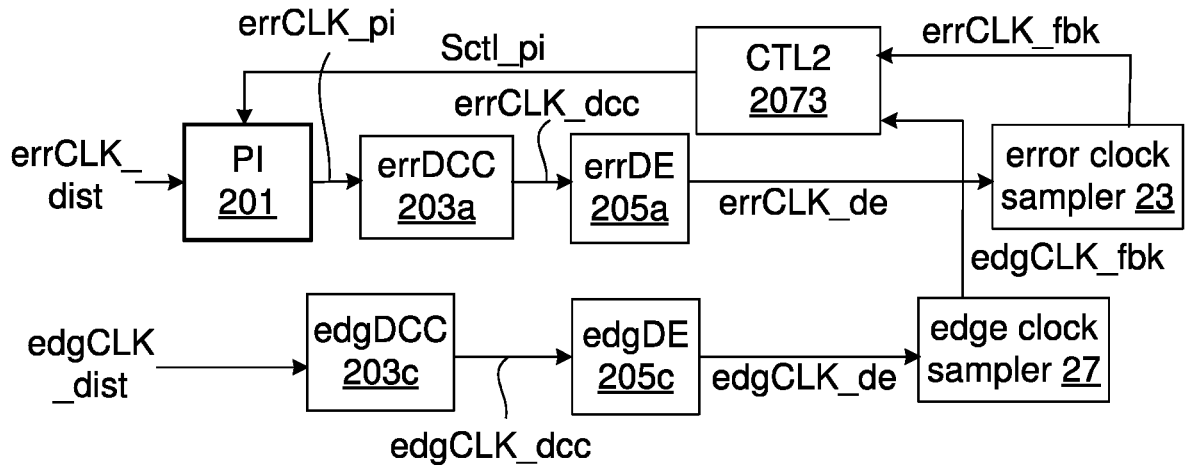
FIG. 12 is a schematic diagram illustrating the components in the calibration circuit, which are related to coarsely adjusting the phase of the phase interpolated error clock (errCLK_pi).

FIG. 12 is a schematic diagram illustrating the components in the calibration circuit, which are related to coarsely adjusting the phase of the phase interpolated error clock (errCLK_pi). FIG. 12 is corresponding to step S309 in FIG. 5. The control circuit (CTL2) 2073 receives the feedback clock (errCLK_fbk) from error clock sampler 23, and the feedback clock (edgCLK_fbk) from the edge clock sampler 27, respectively. Then, the control circuit (CTL2) 2073 outputs a phase interpolation control signal (Sctl_pi) to set the value of the phase interpolator 201. According to the phase interpolation control signal (Sctl_pi), the phase interpolator 201 generates the phase interpolated error clock (errCLK_pi) with variable phase. Thus, phases of the duty cycle adjusted clock (errCLK_dcc), the delay adjusted clock (errCLK_de), and the feedback clock (errCLK_fbk) are also modified in response to the phase adjustment of the phase interpolated error clock (errCLK_pi).

Figure 13:
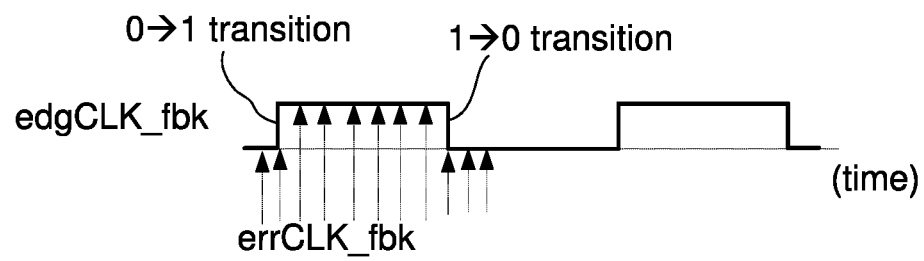
FIG. 13 is a schematic diagram illustrating that the rising edges of the feedback clock (errCLK_fbk) are repetitively used to sample the logic level of the feedback clock (edgCLK_fbk).

FIG. 13 is a schematic diagram illustrating that the rising edges of the feedback clock (errCLK_fbk) are repetitively used to sample the logic level of the feedback clock (edgCLK_fbk). The sampling result shows that the feedback clock (edgCLK_fbk) is equivalent to the high logic level "1", equivalent to the low logic level "0", or in transition ("140", or "041"). The sampling result is then referred by the control circuit (CTL2) 2073, as shown in FIG. 14.

Figure 14:
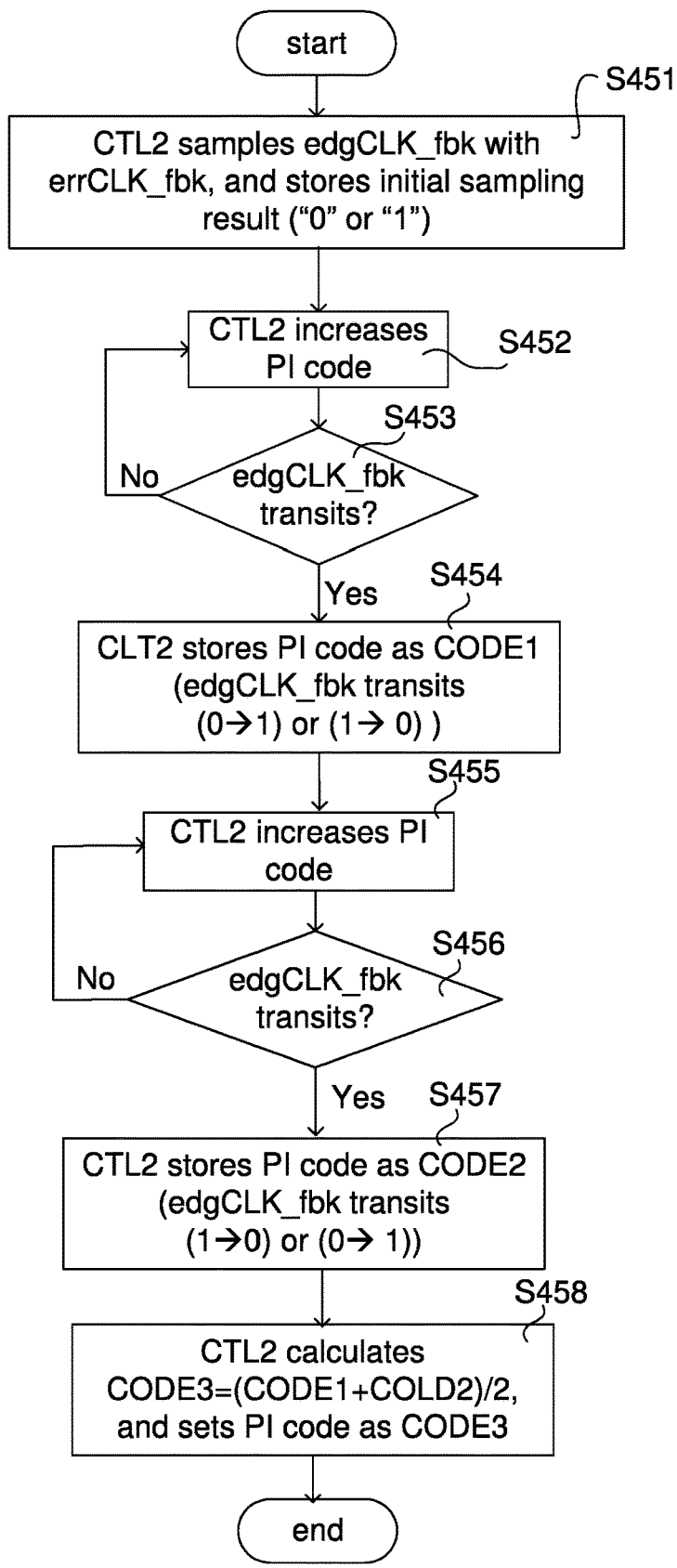
FIG. 14 is a flow diagram illustrating how the phase interpolator coarsely adjusts the phase of the phase interpolated error clock (errCLK_pi).

FIG. 14 is a flow diagram illustrating how the phase interpolator coarsely adjusts the phase of the phase interpolated error clock (errCLK_pi). The control circuit (CTL2) 2073 firstly samples the feedback clock (edgCLK_fbk) with the rising edge of the feedback clock (errCLK_fbk), and stores an initial sampling result (0 or 1). Then, the control circuit (CTL2) 2073 increases the phase interpolator code (PI code) of the phase interpolator (PI) 201 (step S452). The PI code is continuously increased until the feedback clock (errCLK_fbk) is in transition (step S453). Then, the control circuit (CTL2) 2073 stores the PI code as a first PI code (CODE1) (step S454).

Later, the control circuit (CTL2) 2073 again gradually increases the PI code of the phase interpolator 201 (step S455). Meanwhile, the control circuit (CTL2) 2073 continuously samples the feedback clock (edgCLK_fbk) with the rising edge of the feedback clock (errCLK_fbk). The PI code is continuously increased until the feedback clock (edgCLK_fbk) is in transition again (step S456). Then, the control circuit (CTL2) 2073 stores the PI code as a second PI code (CODE2) (step S457).

Once the second PI code (CODE2) is obtained, the control circuit (CTL2) 2073 stops sampling the feedback clock (edgCLK_fbk) with the rising edge of the feedback clock (errCLK_fbk). Then, the control circuit (CTL2) 2073 calculates an average value of the first PI code (CODE1) and the second PI code (CODE2). The average value of the first PI code (CODE1) and the second PI code (CODE2) is defined as a third PI code (CODE3). Later, the control circuit (CTL2) 2073 sets the phase interpolator 201 with the third PI code (CODE3).

In step S451, if the initial sampling result of the feedback clock (edgCLK_fbk) is at the low logic level "0", the first PI code (CODE1) is corresponding to the scenario that the feedback clock (edgCLK_fbk) transits from the low logic level to the high logic level "0→1" in step S454, and the second PI code (CODE2) is corresponding to the scenario that the feedback clock (edgCLK_fbk) transits from the high logic level to the low logic level "1→0" in step S457. Consequentially, the third PI code (CODE3) thus represents the PI code that will make the feedback clock (errCLK_fbk) samples to the center of the high logic level duration of the feedback clock (edgCLK_fbk).

In step S451, if the initial sampling result of the feedback clock (edgCLK_fbk) is at the high logic level "1", the first PI code (CODE1) is corresponding to the scenario that the feedback clock (edgCLK_fbk) transits from the high logic level to the low logic level "1→0" in step S454, and the second PI code (CODE2) is corresponding to the scenario that the feedback clock (edgCLK_fbk) transits from the low logic level to the high logic level "0→1" in step S457. Consequentially, the third PI code (CODE3) thus represents the PI code that will make the rising edges of the feedback clock (errCLK_fbk) directly sample the center of the low logic level duration of the feedback clock (edgCLK_fbk). Therefore, the phase difference between the feedback clocks (edgCLK_fbk, errCLK_fbk) is very close to 90 degrees when the phase interpolator (PI) 201 is set by the third PI code (CODE3).

FIG. 15 is a schematic diagram illustrating that the rising edges of the feedback clock (errCLK_fbk) are repetitively used to sample the state of the feedback clock (edgCLK_fbk) after the phase of the feedback clock (errCLK_fbk) has been coarsely adjusted. Similar to FIG. 13, the rising edge of the feedback clock (errCLK_fbk) is again repetitively used to sample the feedback clock (edgCLK_fbk). After the flow diagram shown in FIG. 14 is performed, the rising edges of the feedback clock (errCLK_fbk) are limited to a certain range, that is, close to the center of the high logic level "1" duration of the feedback clock (edgCLK_fbk).

Basically, the rising edges of the feedback clock (errCLK_fbk) are expected to target to the center of the low/high logic level durations of the delay adjusted clock (edgCLK_de) after the phase interpolator (PI) 201 has been set with the third PI code (CODE3). However, there might be a minor error in the position of the feedback clock (errCLK_fbk). The minor error might be caused by the finite resolution, the integral nonlinearity (INL) error, and/or the differential nonlinearity (DNL) error of the phase interpolator (PI) 201. Thus, a fine-tune operation targeting the phase of the phase interpolated error clock (errCLK_pi) is required.

Figure 16:
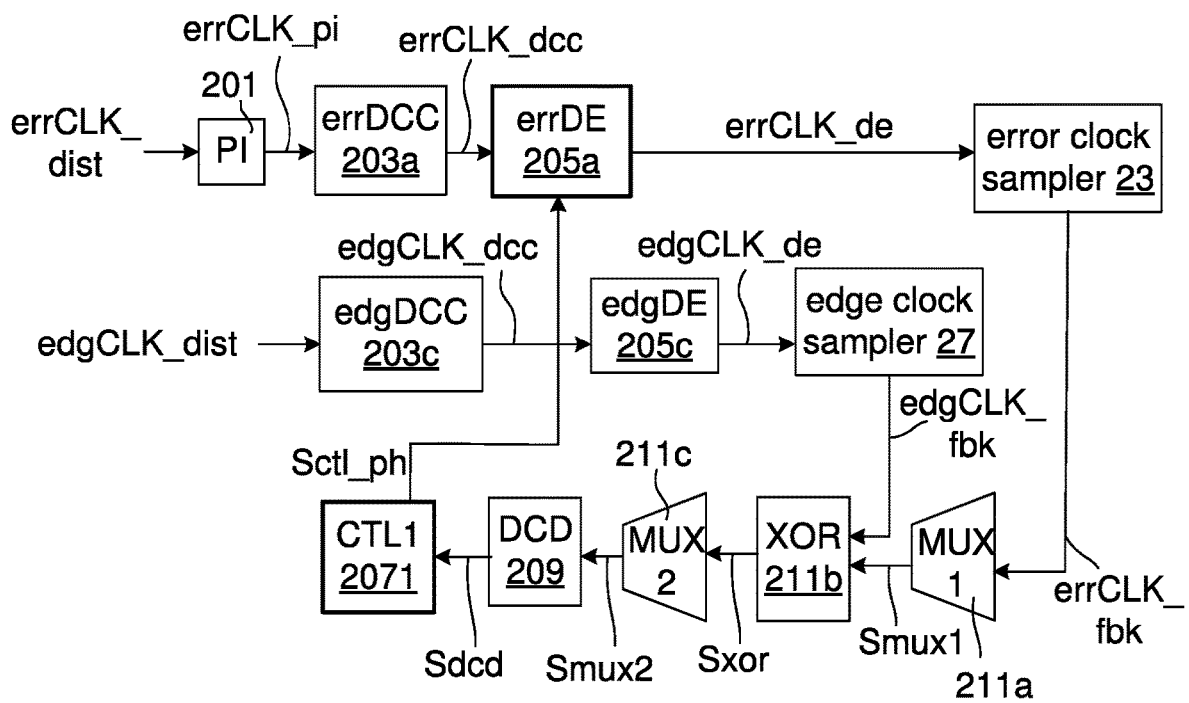
FIG. 16 is a schematic diagram illustrating the components in the calibration circuit, which are related to the fine tune of the delay adjusted clock (errCLK_de).

FIG. 16 is a schematic diagram illustrating the components in the calibration circuit, which are related to the fine tune of the delay adjusted clock (errCLK_de). FIG. 16 is corresponding to step S311 in FIG. 5. The clock selector (MUX1) 211a selects the feedback clock (errCLK_fbk) as its input, so the selected signal (Smux1) is equivalent to the feedback clock (errCLK_fbk). The comparison circuit (XOR) 211b receives the feedback clock (edgCLK_fbk) and the selected signal (Smux1) as its inputs.

Therefore, the duty cycle of the comparison signal (Sxor) represents the phase relationship between the feedback clocks (edgCLK_fbk, errCLK_fbk). When the phase difference between the feedback clocks (edgCLK_fbk, errCLK_fbk) is equivalent to 90 degrees, the duty cycle of the comparison signal (Sxor) is equivalent to 50%. When the phase difference between the feedback clocks (edgCLK_fbk, errCLK_fbk) is less than 90 degrees, the duty cycle of the comparison signal (Sxor) is shorter than 50%. When the phase difference between the feedback clocks (edgCLK_fbk, errCLK_fbk) is greater than 90 degrees, the duty cycle of the comparison signal (Sxor) is higher than 50%.

Moreover, as the comparison signal (Sxor) is selected as the input of the selected signal (Smux2), the duty cycle detection signal (Sdcd) is basically utilized to represent the duty cycle of the comparison signal (Sxor). Therefore, by referring to the duty cycle detection signal (Sdcd), the control circuit (CTL1) 2071 is aware of the phase relationship between the feedback clocks (edgCLK_fbk, errCLK_fbk). Then, the control circuit (CTL1) 2071 can generate the phase control signal (Sctl_ph) to adjust the phase difference between the feedback clocks (edgCLK_fbk, errCLK_fbk). In FIG. 16, the phase control signal (Sctl_ph) is utilized to set the delay circuit (errDE) 205a only, not the delay circuit (edgDE) 205c.

As illustrated above, after step S305, phases, and duty cycles of the feedback clocks (edgCLK_fbk, errCLK_fbk) are precise. Therefore, by the time when step S311 is performed, the delay circuit (edgDE) 205c should remain unchanged, and the delay circuit (errDE) 205a should be set. The possible operations of the control circuit (CTL1) 2071 in FIG. 16 are summarized in Table 7.

TABLE 7

| duty cycle detection signal (Sdcd) | duty cycle of selected signal (Smux2) | phase difference between feedback clocks (edgCLK_fbk, errCLK_fbk) | Related operations |
|---|---|---|---|
| duty cycle detection signal (Sdcd) transits between "0" and "1." | duty cycle of selected signal (Smux2) = 50% | 90 degrees | control circuit (CTL1) does not adjust control circuit (errDE) |
| duty cycle detection signal (Sdcd) = "0" | duty cycle of selected signal (Smux2) <50% | <90 degrees | control circuit (CTL1) sends phase control signal (Sctl_ph) to adjust delay circuit (errDE) (to extend delay of delay adjusted clock (errCLK_de)) |
| duty cycle detection signal (Sdcd) = "1" | duty cycle of selected signal (Smux2) >50% | >90 degrees | control circuit (CTL1) sends phase control signal (Sctl_ph) to adjust delay circuit (errDE) (to shorten delay of delay adjusted clock (errCLK_de)) |

By providing the calibration circuit, duty cycles and phases of the sampling clocks (errCLK_smp, datCLK_smp, edgCLK_smp) and the feedback clocks (errCLK_fbk, datCLK_fbk, edgCLK_fbk) are corrected. In the specification, the feedback clocks (errCLK_fbk, datCLK_fbk, edgCLK_fbk) are synchronized with sampling clocks (errCLK_smp, datCLK_smp, edgCLK_smp). Therefore, the sampling circuits in the error/data/edge clock samplers can receive precise sampling clocks (errCLK_smp, datCLK_smp, edgCLK_smp).

In the SerDes circuit, the data clock sampler 25 and the edge clock sampler 27 are used for data sampling. On the other hand, the error clock sampler 23 is adapted for eye-opening monitor (EOM) of the SerDes circuit. Therefore, the calibrations of the input clocks (datCLK_dist, edgCLK_dist) are directly related to the physical layer (PHY) of the SerDes circuit. Whereas, the calibration of the input clock (errCLK_dist) is related to the initial calibration and monitoring function of the SerDes circuit. In applications that the EOM of the SerDes circuit is not concerned, it is possible to omit the error-clock calibration path and the error clock sampler 23. Moreover, only steps S301, S303, and S305 shown in FIG. 4 need to be performed. For the applications adapting the error-clock calibration path, no extra physical circuit is required by the error-clock calibration path. Therefore, the error-clock calibration path does not introduce extra power consumption nor increase the area cost.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A calibration circuit, comprising:
   a duty cycle correction circuit, configured for generating a first duty cycle adjusted clock based on a first input clock, and generating a second duty cycle adjusted clock based on a second input clock, wherein frequency of the first input clock and frequency of the second input clock are equivalent;
   a phase correction circuit, electrically connected to the duty cycle correction circuit, configured for generating a first delay adjusted clock based on a phase of the first duty cycle adjusted clock, and generating a second delay adjusted clock based on a phase of the second duty cycle adjusted clock;
   a clock selection circuit, electrically connected to the phase correction circuit, comprising:
      a first clock selector, configured for outputting a first selected signal based on a first feedback clock, wherein the first feedback clock is generated from the first delay adjusted clock;
      a comparison circuit, electrically connected to the first clock selector, configured for generating a comparison signal based on a second feedback clock and the first selected signal, wherein the second feedback clock is generated from the second delay adjusted clock; and
      a second clock selector, electrically connected to the comparison circuit, configured for outputting a second selected signal based on the second feedback clock, the comparison signal, and the first selected signal, wherein the second selected signal is related to generation of a detection signal, wherein the detection signal is related to a duty cycle of the first input clock, a duty cycle of the second input clock, and a phase difference between the second delay adjusted clock and the first delay adjusted clock; and
   a first control circuit, electrically connected to the duty cycle correction circuit, the phase correction circuit, and the clock selection circuit, configured for controlling the duty cycle correction circuit and the phase correction circuit in response to the detection signal.

2. The calibrating circuit according to claim 1, wherein the first input clock is related to a recovered data clock, and the second input clock is related to a recovered edge clock.

3. The calibration circuit according to claim 1, wherein the first control circuit transmits a first duty cycle control signal and a second duty cycle control signal to the duty cycle correction circuit, and the duty cycle correction circuit comprises:
   a first duty cycle corrector, electrically connected to the first control circuit, configured for receiving the first input clock and the first duty cycle control signal, and generating the first duty cycle adjusted clock, wherein a duty cycle of the first duty cycle adjusted clock is adjusted in response to the first duty cycle control signal; and
   a second duty cycle corrector, electrically connected to the first control circuit, configured for receiving the second input clock and a second duty cycle control signal, and generating the second duty cycle adjusted clock, wherein a duty cycle of the second duty cycle adjusted clock is adjusted in response to the second duty cycle control signal.

4. The calibration circuit according to claim 3, wherein the first control circuit transmits a first phase control signal and a second phase control signal to the phase correction circuit, and the phase correction circuit comprises:
   a first delay circuit, electrically connected to the first duty cycle corrector and the first control circuit, configured for receiving the first duty cycle adjusted clock and the first phase control signal, and generating the first delay adjusted clock, wherein a phase of the first delay adjusted clock is adjusted based on the first phase control signal; and
   a second delay circuit, electrically connected to the second duty cycle corrector and the first control circuit, configured for receiving the second duty cycle adjusted clock and the second phase control signal, and generating the second delay adjusted clock, wherein a phase of the second delay adjusted clock is adjusted based on the second phase control signal.

5. The calibration circuit according to claim 4, further comprises:
   a duty cycle detector, electrically connected to the second clock selector, and the first control circuit, configured for generating the detection signal according to a duty cycle of the second selected signal.

6. The calibration circuit according to claim 5, wherein the first control circuit generates the first duty cycle control signal according to the detection signal when the first feedback clock is selected as an input of the first clock selector, and the first selected signal is selected as an input of the second clock selector.

7. The calibration circuit according to claim 5, wherein the first control circuit generates the second duty cycle control signal according to the detection signal when the second feedback clock is selected as an input of the second clock selector.

8. The calibration circuit according to claim 5, wherein the first control circuit generates at least one of the first phase control signal and the second phase control signal according to the detection signal when the first feedback clock is selected as an input of the first clock selector, and the comparison signal is selected as an input of the second clock selector.

9. The calibration circuit according to claim 8, wherein
a duty cycle of the comparison signal is shorter than 50% when the phase difference between the second feedback clock and the first feedback clock is less than 90 degrees;
the duty cycle of the comparison signal is higher than 50% when the phase difference between the second feedback clock and the first feedback clock is greater than 90 degrees; and
the duty cycle of the comparison signal is equivalent to 50% when the phase difference between the second feedback clock and the first feedback clock is equivalent to 90 degrees.

10. The calibration circuit according to claim 9, wherein the comparison signal is selected as the input of the second clock selector, wherein
the detection signal is equivalent to a first logic level when the duty cycle of the second selected signal is shorter than 50%;
the detection signal is equivalent to a second logic level when the duty cycle of the second selected signal is higher than 50%; and
the detection signal transits between the first logic level and the second logic level when the duty cycle of the second selected signal is equivalent to 50%.

11. The calibration circuit according to claim 1, further comprising:
a phase interpolator, electrically connected to the duty cycle correction circuit, configured for receiving a third input clock and generating a phase interpolated error clock based on a phase interpolator code, wherein the phase interpolator code is set by a phase interpolation control signal, and the frequency of the first input clock and frequency of the third input clock are equivalent; and
a second control circuit, electrically connected to the phase correction circuit, the clock selection circuit, and the phase interpolator, configured for generating the phase interpolation control signal based on the second feedback clock and a third feedback clock, wherein the third feedback clock is generated from a third delay adjusted clock.

12. The calibration circuit according to claim 11, wherein the duty cycle correction circuit further comprises a third duty cycle corrector, and the phase correction circuit further comprises a third delay circuit, wherein
the third duty cycle corrector and the third delay circuit are electrically connected to the first control circuit, and the third delay circuit is electrically connected to the clock selection circuit, the second control circuit, and the third duty cycle corrector.

13. The calibration circuit according to claim 12, wherein
the third duty cycle corrector receives the phase interpolated error clock from the phase interpolator and a third duty cycle control signal from the first control circuit and generates a third duty cycle adjusted clock, wherein a duty cycle of the third duty cycle adjusted clock is adjusted in response to the third duty cycle control signal; and
the third delay circuit receives the third duty cycle adjusted clock from the third duty cycle corrector and a third phase control signal from the first control circuit, and generates the third delay adjusted clock, wherein a phase of the third delay adjusted clock is adjusted based on the third phase control signal.

14. The calibration circuit according to claim 13, wherein the first control circuit generates the third duty cycle control signal according to the detection signal when the third feedback clock is selected as an input of the first clock selector, and the first selected signal is selected as an input of the second clock selector.

15. The calibration circuit according to claim 13, wherein
the first control circuit generates the third phase control signal according to the detection signal when the third feedback clock is selected as an input of the first clock selector, and the comparison signal is selected as an input of the second clock selector.

16. The calibration circuit according to claim 15, wherein
a duty cycle of the comparison signal is equivalent to 50% when a phase difference between the second feedback clock and the third feedback clock is equivalent to 90 degrees;
the duty cycle of the comparison signal is shorter than 50% when the phase difference between the second feedback clock and the third feedback clock is less than 90 degrees; and
the duty cycle of the comparison signal is higher than 50% when the phase difference between the second feedback clock and the third feedback clock is greater than 90 degrees.

17. The calibration circuit according to claim 11, wherein
the second control circuit continuously changes the phase interpolator code and samples a logic level of the second feedback clock with the third feedback clock;
the second control circuit records the phase interpolator code as a first phase interpolator value when the sampled logic level of the second feedback clock transits from a first logic level to a second logic level;
the second control circuit records the phase interpolator code as a second phase interpolator value when the sampled logic level of the second feedback clock transits from the second logic level to the first logic level; and
the second control circuit sets the phase interpolator code with a third phase interpolator value, wherein the third phase interpolator value is obtained based on the first phase interpolator value and the second phase interpolator value.

18. The calibration circuit according to claim 17, wherein the third phase interpolator value is an average of the first phase interpolator value and the second phase interpolator value, wherein the first feedback clock is synchronized with the third feedback clock.

19. A calibrating method applied to a calibration circuit comprising
a duty cycle correction circuit and a phase correction circuit, comprising following steps:
generating a first duty cycle adjusted clock and a second duty cycle adjusted clock by the duty cycle correction circuit based on a first input clock and a second input clock, respectively, wherein frequency of the first input clock and frequency of the second input clock are equivalent;
generating a first delay adjusted clock and a second delay adjusted clock by the phase correction circuit based on a phase of the first duty cycle adjusted clock;
outputting a first selected signal based on a first feedback clock, wherein the first feedback clock is generated from the first delay adjusted clock;
generating a comparison signal based on a second feedback clock and the first selected signal, wherein the second feedback clock is generated from the second delay adjusted clock;

outputting a second selected signal based on the second feedback clock, the comparison signal, and the first selected signal;

generating a detection signal based on the second selected signal, wherein the detection signal is related to a duty cycle of the first input clock, a duty cycle of the second input clock, and a phase difference between the second delay adjusted clock and the first delay adjusted clock; and controlling the duty cycle correction circuit and the phase correction circuit in response to the detection signal.

20. A calibration circuit, comprising:

a duty cycle correction circuit, configured for generating a first duty cycle adjusted clock based on a first input clock, and generating a second duty cycle adjusted clock based on a second input clock, wherein frequency of the first input clock and frequency of the second input clock are equivalent;

a phase correction circuit, electrically connected to the duty cycle correction circuit, configured for generating a first delay adjusted clock based on a phase of the first duty cycle adjusted clock, and generating a second delay adjusted clock based on a phase of the second duty cycle adjusted clock;

a sampling module, electrically connected to the phase correction circuit, configured for generating a first feedback clock based on the first delay adjusted clock, and generating a second feedback clock based on the second delay adjusted clock;

a clock selection circuit, electrically connected to the sampling module, configured for generating a detection signal based on the first feedback clock and the second feedback clock, wherein the detection signal is related to a duty cycle of the first input clock, a duty cycle of the second input clock, and a phase difference between the first feedback clock and the second feedback clock; and a first control circuit, electrically connected to the duty cycle correction circuit, the phase correction circuit, and the clock selection circuit, configured for controlling the duty cycle correction circuit and the phase correction circuit in response to the detection signal.

\* \* \* \* \*